(12) United States Patent
Bedarida et al.

(10) Patent No.: US 8,837,252 B2
(45) Date of Patent: Sep. 16, 2014

(54) MEMORY DECODER CIRCUIT

(75) Inventors: Lorenzo Bedarida, Vimercate (IT);
Nicolas Zammit, Aix en Provence (FR);
Emmanuel Racape, Aix-en-Provence (FR)

(73) Assignee: Atmel Corporation, San Jose, CA (US)

( * ) Notice: Subject to any disclaimer, the term of this patent is extended or adjusted under 35 U.S.C. 154(b) by 275 days.

(21) Appl. No.: 13/485,675

(22) Filed: May 31, 2012

(65) Prior Publication Data
US 2013/0322185 A1 Dec. 5, 2013

(51) Int. Cl.
*G11C 11/00* (2006.01)

(52) U.S. Cl.
USPC ............. 365/230.06; 365/189.05; 365/189.09

(58) Field of Classification Search
CPC .............. G11C 8/10; G11C 8/08; G11C 8/12
USPC ............................ 365/230.06, 189.05, 189.11
See application file for complete search history.

(56) References Cited

U.S. PATENT DOCUMENTS

| | | | |
|---|---|---|---|
| 5,949,712 A | 9/1999 | Rao et al. | |
| 6,044,012 A | 3/2000 | Rao et al. | |
| 6,337,807 B2 | 1/2002 | Futatsuyama et al. | |
| 6,487,139 B1 * | 11/2002 | Pathak | 365/230.06 |
| 6,549,458 B1 | 4/2003 | Rao et al. | |
| 6,947,328 B1 | 9/2005 | Smidt et al. | |
| 7,042,772 B2 | 5/2006 | Wang et al. | |
| 7,203,124 B2 * | 4/2007 | Kim et al. | 365/230.06 |
| 7,495,965 B2 | 2/2009 | Suzuki et al. | |
| 7,505,355 B2 | 3/2009 | Kanda et al. | |
| 7,542,351 B2 | 6/2009 | Choy et al. | |
| 7,583,533 B2 | 9/2009 | Kutsukake et al. | |
| 7,633,095 B1 | 12/2009 | Kerr et al. | |
| 7,701,785 B2 | 4/2010 | Sanjeevarao et al. | |
| 7,859,009 B1 | 12/2010 | Kerr et al. | |
| 7,969,200 B2 | 6/2011 | Tomoeda et al. | |
| 7,974,051 B2 | 7/2011 | Sato et al. | |
| 7,989,889 B1 | 8/2011 | Kerr et al. | |
| 8,003,469 B2 | 8/2011 | Lee et al. | |
| 8,009,481 B2 | 8/2011 | Nirschl | |
| 8,049,259 B2 | 11/2011 | Noguchi et al. | |
| 8,049,267 B2 | 11/2011 | Sugimae et al. | |
| 8,054,694 B2 | 11/2011 | Racape | |
| 8,076,192 B2 | 12/2011 | Taniguchi et al. | |
| 8,089,816 B2 | 1/2012 | Yamada et al. | |
| 8,134,882 B2 | 3/2012 | Dono | |
| 2007/0171589 A1 | 7/2007 | Otake | |
| 2008/0252634 A1 | 10/2008 | Sato et al. | |
| 2009/0194841 A1 | 8/2009 | Magome et al. | |
| 2009/0236672 A1 | 9/2009 | Harashima et al. | |
| 2010/0202183 A1 | 8/2010 | Kurjanowicz | |
| 2011/0103149 A1 | 5/2011 | Katsumata et al. | |
| 2012/0044733 A1 | 2/2012 | Scheuerlein | |
| 2012/0044759 A1 | 2/2012 | Takahashi | |

OTHER PUBLICATIONS

Tanzawa et al; Circuit Techniques for a 1.8-V-Only NAND Flash Memory; Jan. 2002; pp. 84-89; IEEE Journal of Solid-State Circuits.

* cited by examiner

*Primary Examiner* — Son Dinh
(74) *Attorney, Agent, or Firm* — Fish & Richardson P.C.

(57) ABSTRACT

A decoder circuit includes high voltage and low voltage transistors. The decoder circuit uses the high voltage transistors during modify operations to provide a high voltage, e.g., a boosted voltage, to memory cells to change memory cell status or perform other operations. The decoder circuit uses the low voltage transistors during read operations.

16 Claims, 5 Drawing Sheets

US 8,837,252 B2

MEMORY DECODER CIRCUIT

TECHNICAL FIELD

This disclosure relates generally to electronics and more particularly to memory circuits.

BACKGROUND

Conventional memory circuits typically include memory cells organized into rows and columns. Row and column decoder circuits select a memory cell corresponding to an address. During a read operation, a sense amplifier senses the state of the selected memory cell. During a modify operation, the memory circuit changes the state of the selected memory cell. Some low voltage memory circuits include a charge pump that provides a boosted voltage during modify operations. Some low voltage memory circuits use a charge pump that provides a boosted voltage during read operations, which can reduce the amount of time to perform a read operation, increasing the speed of the memory circuit but increasing power consumption.

SUMMARY

A decoder circuit includes high voltage and low voltage transistors. The decoder circuit uses the high voltage transistors during modify operations to provide the expected high voltages, usually obtained by using pumps, to the memory cell to change its status or to develop a particularly slow operation. The decoder circuit uses the low voltage transistors during read operations, e.g., to increase the speed of the read operations.

Particular implementations of the decoder circuit can provide one or more of the following advantages: 1) the decoder circuit can avoid using a charge pump during read operations, reducing power consumption during read operations; 2) the decoder circuit can still have high voltage transistors to provide high voltages, usually obtained by a charge pump, during modify operations, 3) the dimensions of high voltage transistors can be reduced, decreasing the amount of area of taken by high voltage transistors; and 4) the total area of the decoding circuit can be reduced compared to some conventional decoder circuits.

The details of one or more disclosed implementations are set forth in the accompanying drawings and the description below. Other features, aspects, and advantages will become apparent from the description, the drawings and the claims.

DETAILED DESCRIPTION

Example Memory Circuit

Figure 1:
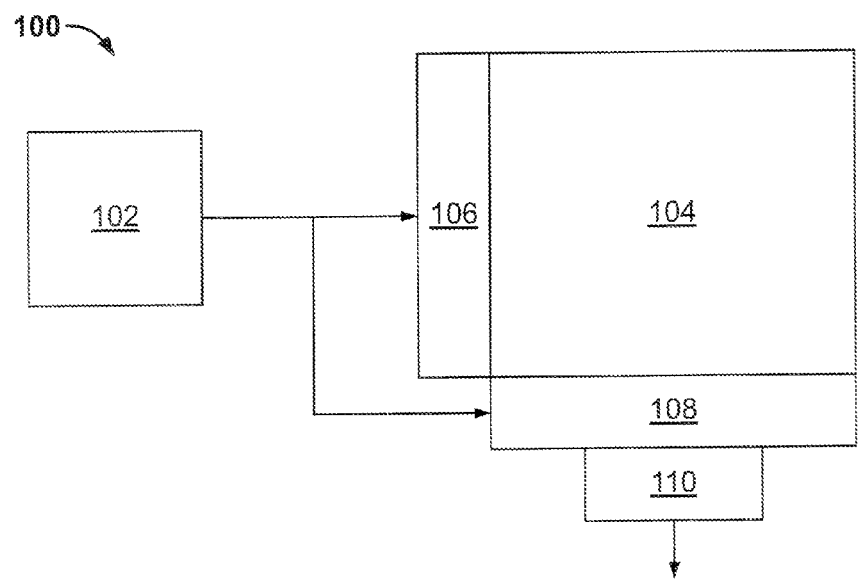
FIG. 1 is a schematic diagram of an example memory circuit.

FIG. 1 is a schematic diagram of an example memory circuit 100. The memory circuit includes a control circuit 102, a matrix 104 of rows and columns of memory cells, a row decoder 106, a column decoder 108, and a sense amplifier 110. The memory cells can be, for example, NAND flash memory, NOR flash memory, EPROM, EEPROM, and other types of memory cells.

The control circuit provides an address for a memory cell to the row decoder and column decoder. The row decoder and column decoder select a memory cell corresponding to the address. During a read operation, the sense amplifier reads the state of the selected memory cell. The row decoder, the column decoder, or both can be implemented using the decoder circuits illustrated in FIGS. 2A-D.

Example Decoder Circuits

Figure 2A:
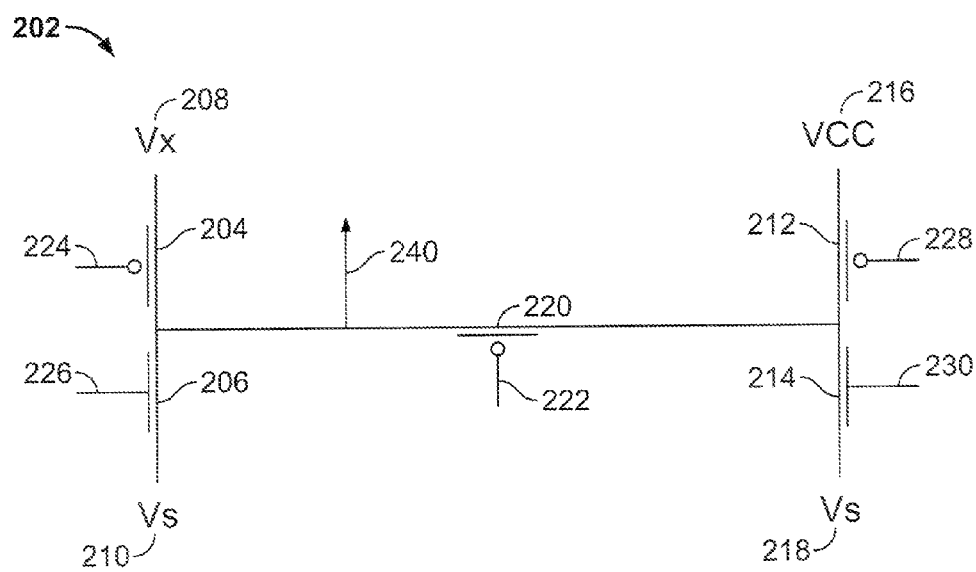
FIG. 2A is a schematic diagram of an example decoder circuit.

FIG. 2A is a schematic diagram of an example decoder circuit 202. The decoder circuit can be used to implement the row decoder 106 of FIG. 1, or the column decoder 108 of FIG. 1, or both.

The decoder circuit includes first and second high voltage transistors 204 and 206. A high voltage transistor can be a transistor that is configured to sustain without damage a voltage that is greater than a supply voltage of the circuit including the transistor. A transistor can be configured to be a high voltage transistor in various ways, for example, by layout sizing rules and by dedicated masks flow generation. In this way, a high voltage transistor can sustain a certain breakdown voltage.

The first high voltage transistor includes a source coupled to a boosted voltage node 208. The boosted voltage node provides a voltage higher than the supply voltage of the circuit. The boosted voltage node can be coupled to a charge pump that is coupled to the supply voltage. Various charge pumps are known in the art, and the operation of the circuit need not depend on the type of charge pump providing the boosted voltage.

The first high voltage transistor includes a drain coupled to a drain of the second high voltage transistor and a decoder output node 240. The second high voltage transistor includes a source coupled to a node 210 that in some implementations is a ground node and in some implementations is controlled or floating.

The decoder circuit includes first and second low voltage transistors 212 and 214. The low voltage transistors can be configured, e.g., by sizing layout rules and dedicated masks flow generation, to have a faster switching time than the high voltage transistors, and the low voltage transistors need not sustain as high of a voltage as the high voltage transistors. For example, the low voltage transistors can be rated at 5V, 3V, 1.2V, and so on.

The first low voltage transistor 212 includes a source coupled to a supply voltage node 216. The first low voltage transistor includes a drain coupled to a drain of the second low voltage transistor. The second low voltage transistor includes a source coupled to a node 218 that can be a ground node, a controlled node, or a floating voltage node.

The high voltage transistors and the low voltage transistors are coupled to a middle transistor 220. The middle transistor is coupled to the decoder output node. The middle transistor is configured, e.g., by layout sizing rules and by dedicated masks flow generation to sustain without damage, the voltage from the boosted node. Hence the middle transistor can be considered a high voltage transistor, but it does not need to be configured with the same size or material as the first and second high voltage transistors. For example, the middle transistor need not have the same switching speed as the first and second high voltage transistors.

The middle transistor includes a gate 222 to receive a control signal. The first and second high voltage transistors also include gates 224 and 226 to receive control signals, and the first and second low voltage transistors also include gates 228 and 230 to receive control signals. A control circuit, e.g., the control circuit of FIG. 1, can provide the control signals.

In operation, the decoder circuit performs read operations and modify operations. During read operations, the first and second high voltage transistors block the boosted voltage from the boosted voltage node from reaching the decoder output node. The middle transistor conducts between the decoder output node and the first and second low voltage transistors. The first and second low voltage transistors polarize a selected memory cell to read the state of the memory cell. The boosted voltage does not reach the low voltage transistors.

During modify operations, the middle transistor substantially blocks current from flowing between the high voltage transistors and the low voltage transistors. The high voltage transistors can apply the boosted voltage to the decoder output node to modify the state of a selected memory cell.

The middle transistor in the example decoder circuit of FIG. 2A is a P type transistor. Hence, the control signal at the gate of the middle transistor will be low during read operations, causing the middle transistor to conduct between its source and drain. The control signal at the gate of the middle transistor will be high during modify operations, causing the middle transistor to substantially block current from flowing between its source and drain.

Figure 2B:
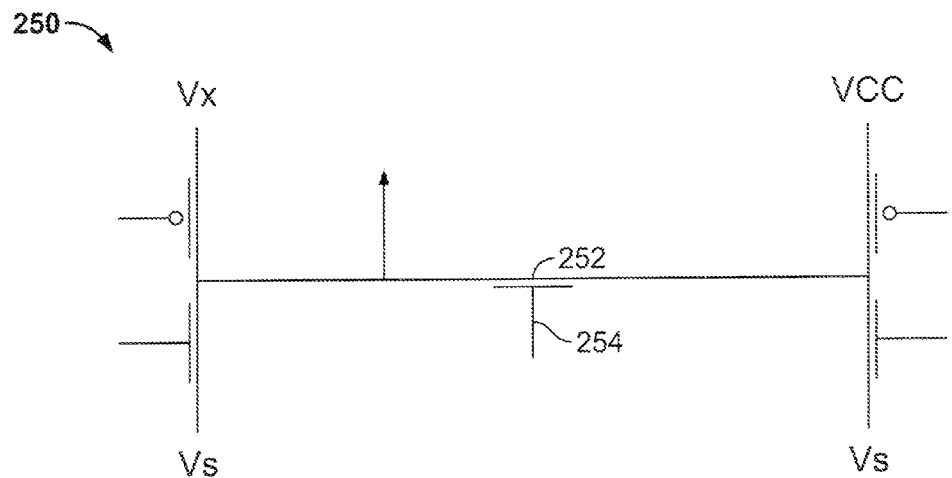
FIG. 2B is a schematic diagram of an alternative example decoder circuit.

FIG. 2B is a schematic diagram of an alternative example decoder circuit 250. The decoder circuit includes a middle transistor 252 that is an N type transistor. Hence the control signal at the gate 254 of the middle transistor will be high during read operations and low during modify operations. In some implementations, a control circuit can provide a boosted control signal to the gate of the middle transistor during read operations. A charge pump can provided the boosted control signal. In these implementations, the size of the middle transistor can be reduced. The boosted control signal during read is fixed and not toggling.

Figure 2C:
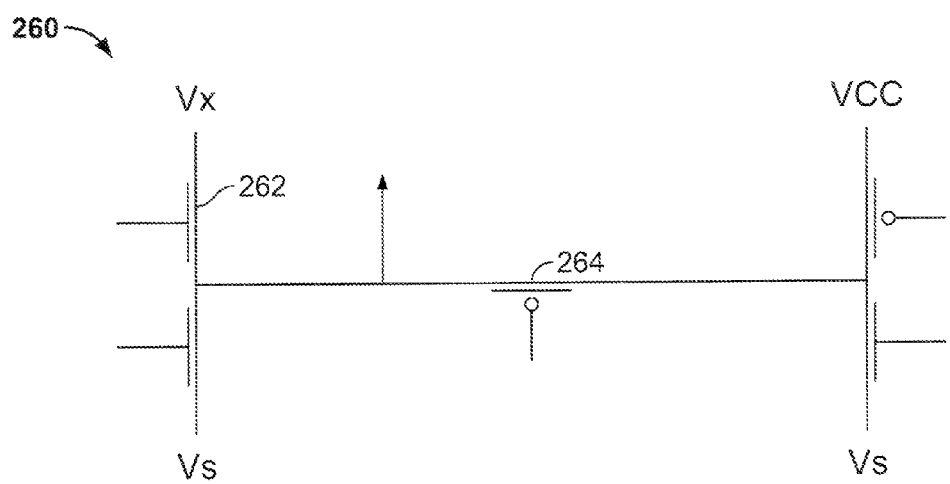
FIG. 2C is a schematic diagram of an alternative example decoder circuit including an N type transistor as the first high voltage transistor.
Figure 2D:
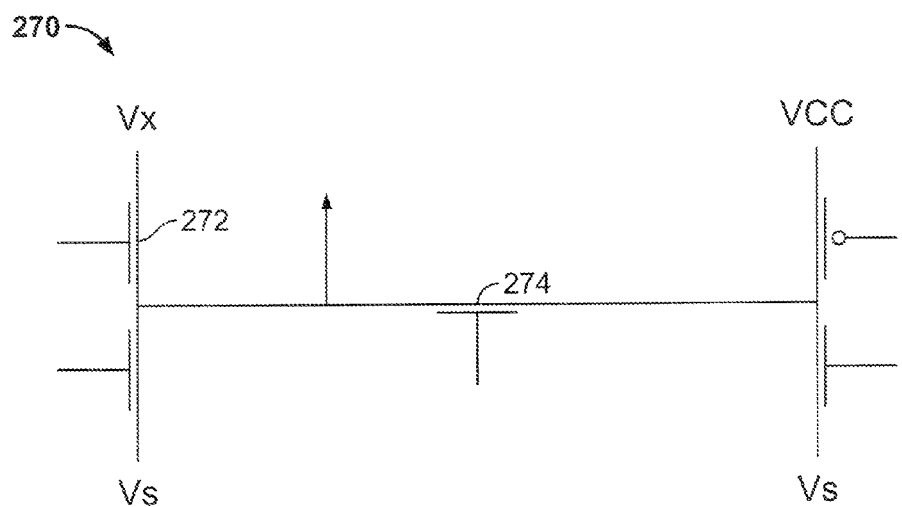
FIG. 2D is a schematic diagram of an alternative example decoder circuit including an N type transistor as the first high voltage transistor and an N type transistor as the middle transistor.

The first high voltage transistor in the example decoder circuits of FIGS. 2A and 2B is a P type transistor. FIG. 2C is a schematic diagram of an alternative example decoder circuit 260 including an N type transistor 262 as the first high voltage transistor. In FIG. 2C, the middle transistor is a P type transistor. FIG. 2D is a schematic diagram of an alternative example decoder circuit 270 including an N type transistor as the first high voltage transistor and an N type transistor as the middle transistor 274. The example decoder circuits of FIG. 2B-D can operate as described with reference to FIG. 2A by providing appropriate control signals to the gates of the transistors. Other possible combinations of N type and/or P type transistors can be implemented. The supply voltage node is typically coupled to a supply voltage but in some implementations can be coupled to a regulated voltage.

Example Row Decoder Circuit for NAND Flash Memory

Figure 3A:
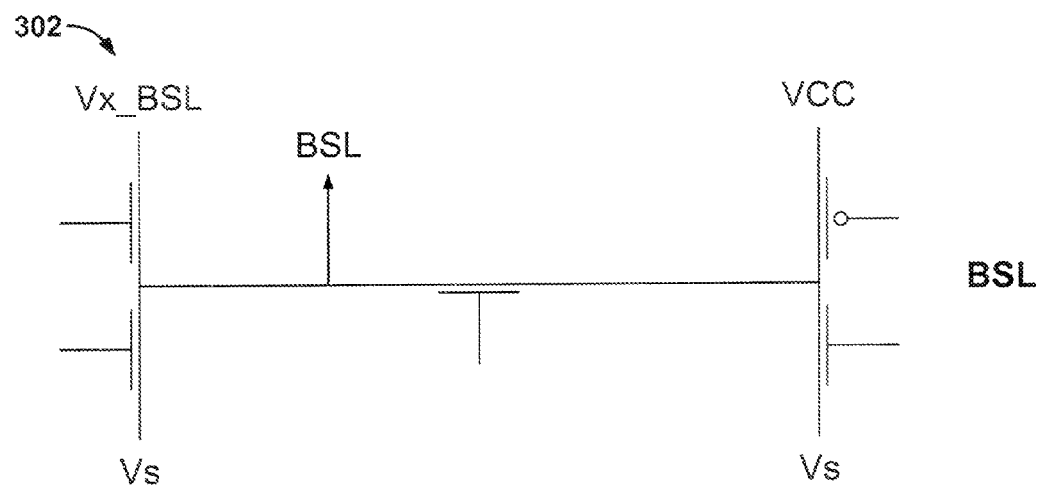
FIGS. 3A-C are schematic diagrams of example decoder circuits for a row decoder for NAND flash memory.
Figure 3B:
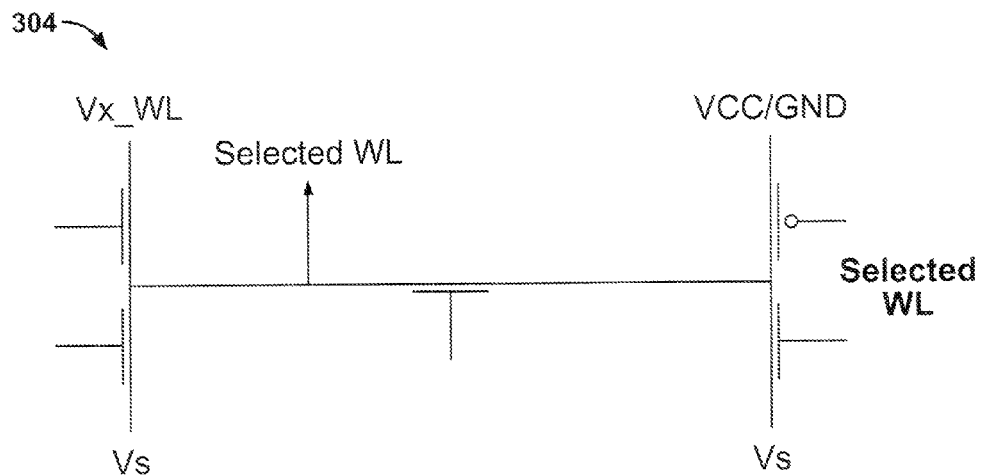
Figure 3C:
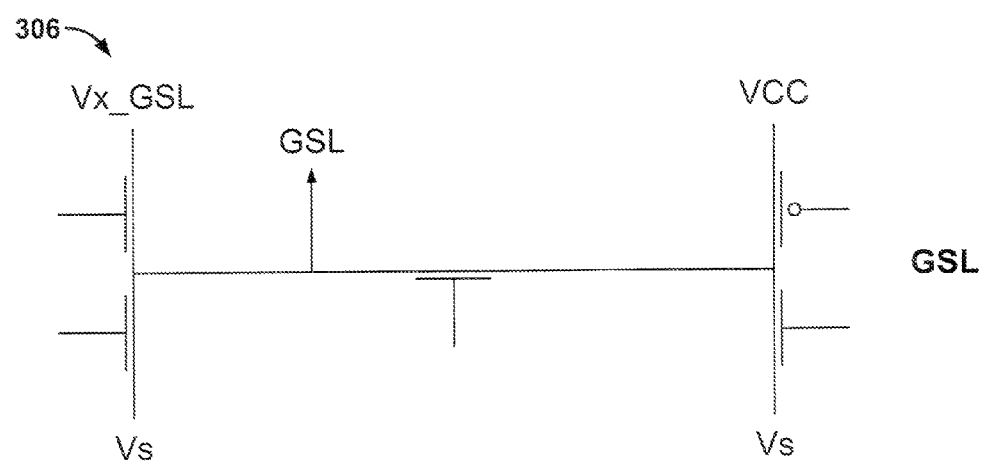

FIGS. 3A-C are schematic diagrams of example decoder circuits for a row decoder for NAND flash memory. The row decoder can be, for example, the row decoder 106 of FIG. 1.

FIG. 3A is a schematic diagram of an example decoder circuit 302 for a bit select line. FIG. 3B is a schematic diagram of an example decoder circuit 304 for a selected word line. FIG. 3C is a schematic diagram of an example decoder circuit 306 for a ground select line. In operation, the three decoder circuits work together to read and modify memory cells of the NAND flash memory. During a read operation, the bit select line and ground select line can be polarized by the supply voltage node VCC. During a modify operation, the middle transistors block current from the boosted voltage nodes and protect the low voltage transistors of the bit select line, word line, and ground select line.

Example Control Method

Figure 4:
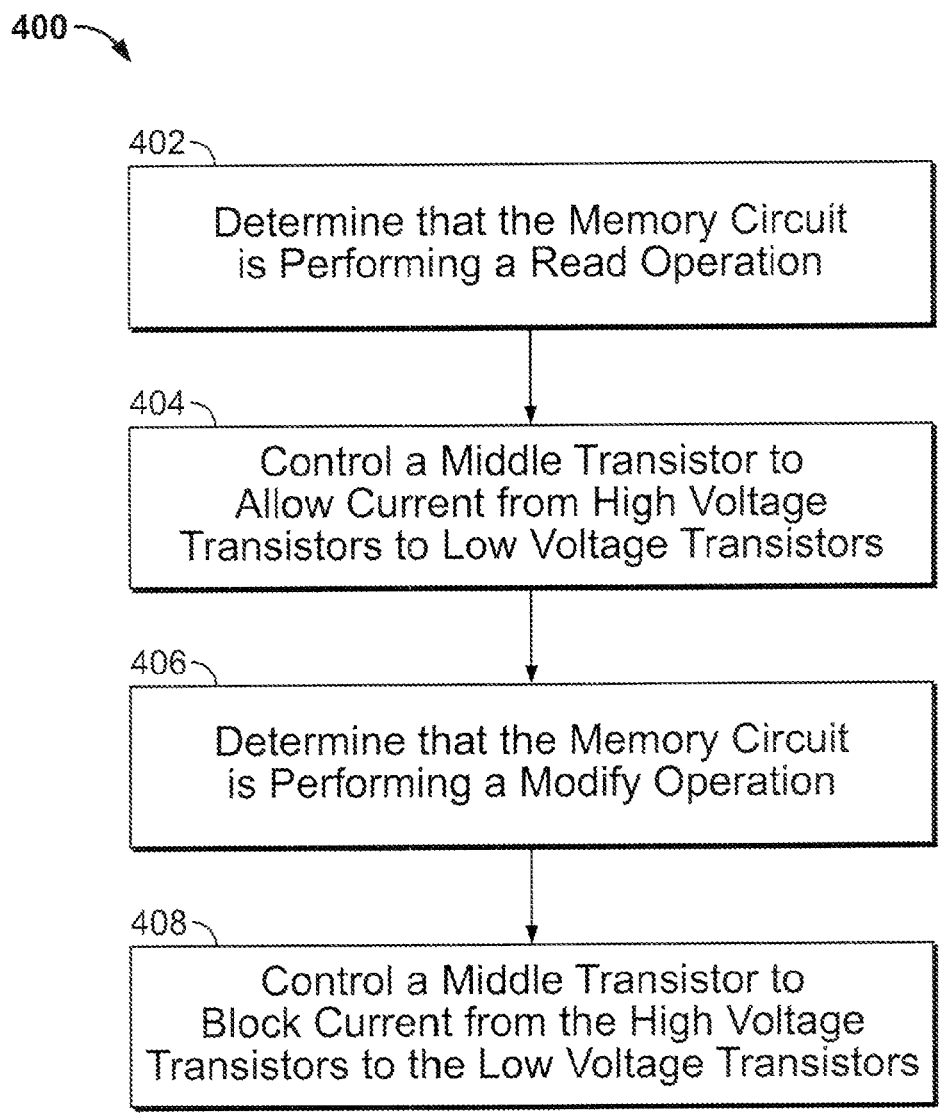
FIG. 4 is a flow diagram of an example method performed by a control circuit for controlling a decoder circuit of a memory circuit.

FIG. 4 is a flow diagram of an example method 400 performed by a control circuit for controlling a decoder circuit of a memory circuit. The method can be performed by the control circuit 102 of FIG. 1, for example.

The control circuit determines that the memory circuit is performing a read operation (step 402). For example, the control circuit can receive a request from a processor to read memory cells at a certain address. In some implementations, to increase the read speed, the memory can be in a read mode state where the middle transistor is already on—allowing current to pass.

The control circuit controls a middle transistor so that the middle transistor allows current to flow from first and second high voltage transistors to first and second low voltage transistors (step 404). For example, the control circuit can provide a control signal to a gate of the middle transistor. During the read operation, the control circuit can control the first and second low voltage transistors to read a selected memory cell by applying a supply voltage to a decoder output node coupled to a source of the middle transistor.

The control circuit determines that the memory circuit is performing a modify operation (step 406). For example, the control circuit can receive a request from a processor to program or erase memory cells at a certain address.

The control circuit controls the middle transistor so that the middle transistor substantially blocks current from flowing from the first and second high voltage transistors to the first and second low voltage transistors (step 408). During the modify operation, the control circuit can control the first and second high voltage transistors to modify a selected memory cell by applying a boosted voltage to the decoder output node.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A memory circuit comprising:
   a plurality of memory cells arranged into a plurality of rows and a plurality of columns;
   a decoder circuit coupled to the plurality of memory cells, the decoder circuit comprising:
      first and second high voltage transistors coupled to a boosted voltage node;
      first and second low voltage transistors coupled to a voltage supply node, wherein the boosted voltage node is configured to provide a voltage higher than a supply voltage at the voltage supply node; and
      a middle transistor coupled between the first and second high voltage transistors and the first and second low voltage transistors.

2. The memory circuit of claim 1, further comprising a control circuit coupled to a gate of the third high voltage transistor, the control circuit configured to perform operations comprising:
   determining that the memory circuit is performing a read operation;
   controlling the middle transistor so that the middle transistor allows current to flow from the first and second high voltage transistors to the first and second low voltage transistors;
   determining that the memory circuit is performing a modify operation; and
   controlling the middle transistor so that the middle transistor substantially blocks current from flowing from the first and second high voltage transistors to the first and second low voltage transistors.

3. The memory circuit of claim 1, wherein the first and second high voltage transistors are configured to sustain a first voltage, and wherein the first and second low voltage transistors are configured to sustain a second voltage lower than the first voltage.

4. The memory circuit of claim 1, wherein the middle transistor is configured to sustain the voltage at the boosted voltage node.

5. The memory circuit of claim 1, wherein the first and second high voltage transistors are configured to switch at a first switching speed, and wherein the first and second low voltage transistors are configure to switch at a second switching speed faster than the first switching speed.

6. The memory circuit of claim 1, wherein the first and second high voltage transistors are coupled to a charge pump coupled to the voltage supply node.

7. The memory circuit of claim 1, wherein the first high voltage transistor includes a drain coupled to the boosted voltage node and a source coupled to a drain of the second high voltage transistor, and wherein the first low voltage transistor includes a source coupled to the voltage supply node and a drain coupled to a drain of the second low voltage transistor.

8. The memory circuit of claim 7, wherein the source of the first high voltage transistor is coupled to a source of the middle transistor.

9. The memory circuit of claim 8, wherein the drain of the first low voltage transistor is coupled to a drain of the middle transistor.

10. The memory circuit of claim 9, wherein the source of the middle transistor is coupled to a decoder output node coupled to the plurality of memory cells.

11. A method performed by a control circuit for a decoder circuit of a memory circuit, the method comprising:
    determining that the memory circuit is performing a read operation;
    controlling a middle transistor so that the middle transistor allows current to flow from first and second high voltage transistors to first and second low voltage transistors;
    determining that the memory circuit is performing a modify operation; and
    controlling the middle transistor so that the middle transistor substantially blocks current from flowing from the first and second high voltage transistors to the first and second low voltage transistors.

12. The method of claim 11, wherein controlling the middle transistor comprises providing a control signal to a gate of the middle transistor.

13. The method of claim 11, further comprising, during the read operation, controlling the first and second low voltage transistors to read a selected memory cell by applying a supply voltage to a decoder output node coupled to a source of the middle transistor.

14. The method of claim 11, further comprising, during the modify operation, controlling the first and second high voltage transistors to modify a selected memory cell by applying a boosted voltage to a decoder output node coupled to a source of the middle transistor.

15. The method of claim 11, wherein the first and second high voltage transistors are configured to sustain a first voltage, and wherein the first and second low voltage transistors are configured to sustain a second voltage lower than the first voltage.

16. The method of claim 11, wherein the first and second high voltage transistors are configured to switch at a first switching speed, and wherein the first and second low voltage transistors are configure to switch at a second switching speed faster than the first switching speed.

* * * * *

UNITED STATES PATENT AND TRADEMARK OFFICE
CERTIFICATE OF CORRECTION

| | | |
|---|---|---|
| PATENT NO. | : 8,837,252 B2 | Page 1 of 1 |
| APPLICATION NO. | : 13/485675 | |
| DATED | : September 16, 2014 | |
| INVENTOR(S) | : Lorenzo Bedarida, Nicolas Zammit and Emmanuel Racape | |

It is certified that error appears in the above-identified patent and that said Letters Patent is hereby corrected as shown below:

In the Claims

Column 5, Line 47 In claim 5, delete "configure" and insert --configured--, therefor.

Column 6 Line 50 (Approx) In claim 16, delete "configure" and insert --configured--, therefor.

Signed and Sealed this
Second Day of June, 2015

Michelle K. Lee
*Director of the United States Patent and Trademark Office*